United States Patent
Park

(10) Patent No.: US 7,088,393 B1
(45) Date of Patent: Aug. 8, 2006

(54) OUTPUT-COMPENSATED BUFFERS WITH SOURCE-FOLLOWER INPUT STRUCTURE, METHODS OF OPERATING SAME, AND IMAGE CAPTURE DEVICES USING SAME

(75) Inventor: Sang-Sik Park, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/399,995

(22) Filed: Sep. 20, 1999

(30) Foreign Application Priority Data

Sep. 21, 1998 (KR) .................................... 98-39101

(51) Int. Cl.
*H04N 3/14* (2006.01)
*H03F 3/16* (2006.01)
*H03F 1/38* (2006.01)
*H03F 1/36* (2006.01)

(52) U.S. Cl. ...................... 348/294; 330/277; 330/391; 330/110

(58) Field of Classification Search .................. 330/85, 330/98, 99, 100, 277, 310, 291, 292, 294, 330/302, 75, 86, 110; 348/294, 300, 311, 348/229.1, 230.1; 327/112, 390, 491, 436, 327/486

See application file for complete search history.

(56) References Cited

U.S. PATENT DOCUMENTS

| | | | | |
|---|---|---|---|---|
| 4,152,595 A | * | 5/1979 | Garfinkel et al. | 327/73 |
| 5,192,920 A | * | 3/1993 | Nelson et al. | 330/277 |
| 5,376,898 A | * | 12/1994 | Tanaka et al. | 330/253 |
| 5,654,673 A | * | 8/1997 | Shinohara | 330/297 |
| 5,777,517 A | * | 7/1998 | Seshita | 330/277 |
| 5,825,249 A | * | 10/1998 | Nakano | 330/277 |
| 5,872,484 A | * | 2/1999 | Hynecek | 330/277 |
| 5,905,256 A | * | 5/1999 | Nakano | 250/214 A |
| 6,023,195 A | * | 2/2000 | Nakano et al. | 330/277 |
| 6,147,556 A | * | 11/2000 | Nakano | 330/277 |
| 6,225,616 B1 | * | 5/2001 | Park | 250/208.1 |

* cited by examiner

*Primary Examiner*—David Ometz
*Assistant Examiner*—Justin Misleh
(74) *Attorney, Agent, or Firm*—Myers Bigel Sibley & Sajovec PA

(57) ABSTRACT

An output-compensated buffer includes a buffer circuit that receives an input signal and produces an output signal responsive thereto at an output terminal, the buffer circuit including an input source-follower circuit that receives the input signal. A feedback circuit is connected to the output terminal and to the input source follower circuit and operative to vary an input capacitance of the source follower circuit responsive to the output signal at the output terminal. The input source follower circuit preferably includes a bias terminal coupled to a power source, and the feedback circuit is preferably capacitively coupled to the bias terminal. According to another aspect, an image capture device includes a charged coupled device (CCD) that generates a video signal. A buffer circuit is responsive to the CCD and operative to receives the video signal and produce an output signal responsive thereto at an output terminal, the buffer circuit including an input source-follower circuit that receives the video signal. A feedback circuit is connected to the output terminal and to the input source follower circuit and operative to vary an input capacitance of the source follower circuit responsive to the output signal at the output terminal.

6 Claims, 7 Drawing Sheets

OUTPUT-COMPENSATED BUFFERS WITH SOURCE-FOLLOWER INPUT STRUCTURE, METHODS OF OPERATING SAME, AND IMAGE CAPTURE DEVICES USING SAME

FIELD OF THE INVENTION

The present invention relates to microelectronic devices, and more particularly, to signal buffers suitable for use in devices such as charged-coupled device (CCD) image capture systems.

BACKGROUND OF THE INVENTION

Charge coupled devices (CCDs) are image capture devices that generally offer superior characteristics such as small size, light weight and low power consumption in comparison to other conventional image capture devices. Accordingly, CCDs are commonly used in broadcasting or domestic video cameras, monitoring cameras, and digital still cameras.

As manufacturing and designing techniques have progressed, the density of CCDs has generally increased, resulting in reduced size. As the size of CCDs has reduced, however, the levels of the signals produced by the image capture elements in CCDs have generally become smaller. Therefore, it has become desirable to use output buffers with high gain to produce signals usable for video processing and other purposes from such weak signals.

A typical output buffer is illustrated in FIG. 1. The output buffer includes an input source follower circuit including respective driving and load NMOS transistors M1, M2 which are biased between a power supply voltage VDD and a signal ground. An input signal, e.g., a signal produced by a horizontal transfer section of a CCD image capture device, is applied to the gate terminal of the driving transistor M1, while a control signal Vg is applied to the gate terminal of the load transistor M2. A voltage produced on the source terminal of the driving transistor M1 is generated responsive to the input signal Vin, and is applied to a second stage source follower circuit including driving and load transistors M3 and M4. The second stage source follower circuit similarly drives a third stage source follower circuit including driving and load transistors M5, M6, producing an output signal Vout. Achieving high gain from such a circuit can be problematic.

SUMMARY OF THE INVENTION

In light of the foregoing, it is an object of the present invention to provide buffers with high-gain, suitable for use with devices such as CCD image capture devices.

It is another object of the present invention to provide buffers having source follower input circuits.

These and other objects, features and advantages may be provided according to the present invention by output-compensated buffers including a buffer circuit that includes a input source follower circuit, and a feedback circuit that variably capacitively couples a bias terminal of the input source follower to a power source, in response to the output of the buffer circuit. The feedback circuit is thus operative to vary the input capacitance of the buffer circuit responsive to the output signal. According to one embodiment of the present invention, the feedback circuit comprises another source follower circuit having an input that receives an output signal from the buffer circuit and an output that is capacitively coupled to the bias terminal of the input source follower circuit.

In particular, according to an embodiment of the present invention, an output-compensated buffer includes a buffer circuit that receives an input signal and produces an output signal responsive thereto at an output terminal, the buffer circuit including an input source-follower circuit that receives the input signal. A feedback circuit is connected to the output terminal and to the input source follower circuit and operative to vary an input capacitance of the source follower circuit responsive to the output signal at the output terminal. The input source follower circuit preferably comprises a bias terminal coupled to a power source, and the feedback circuit is preferably capacitively coupled to the bias terminal.

According to another embodiment of the present invention, the feedback transistor includes a first transistor having source terminal, a drain terminal connected to the power source, and a gate terminal connected to the output terminal of the buffer circuit. The feedback circuit further includes a second transistor having a drain terminal connected to the source terminal of the first transistor at a signal node, a drain terminal connected to a signal ground and a gate terminal configured to receive a control signal. A capacitor is coupled between the signal node and the bias terminal of the source follower circuit.

According to another aspect of the present invention, an image capture device includes a charged coupled device (CCD) that generates a video signal. A buffer circuit is responsive to the CCD and operative to receive the video signal and produce an output signal responsive thereto at an output terminal, the buffer circuit including an input source-follower circuit that receives the video signal. A feedback circuit is connected to the output terminal and to the input source follower circuit and operative to vary an input capacitance of the source follower circuit responsive to the output signal at the output terminal.

DETAILED DESCRIPTION OF PREFERRED EMBODIMENTS

Figure 1:
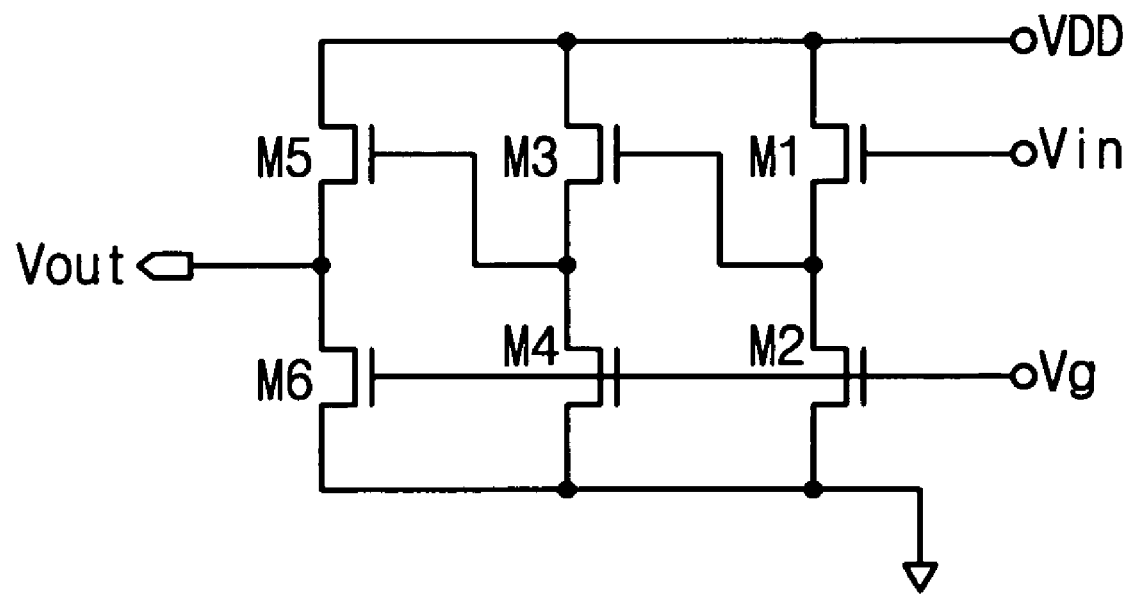
FIG. 1 is a circuit diagram illustrating a conventional buffer with an input source follower circuit.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2:
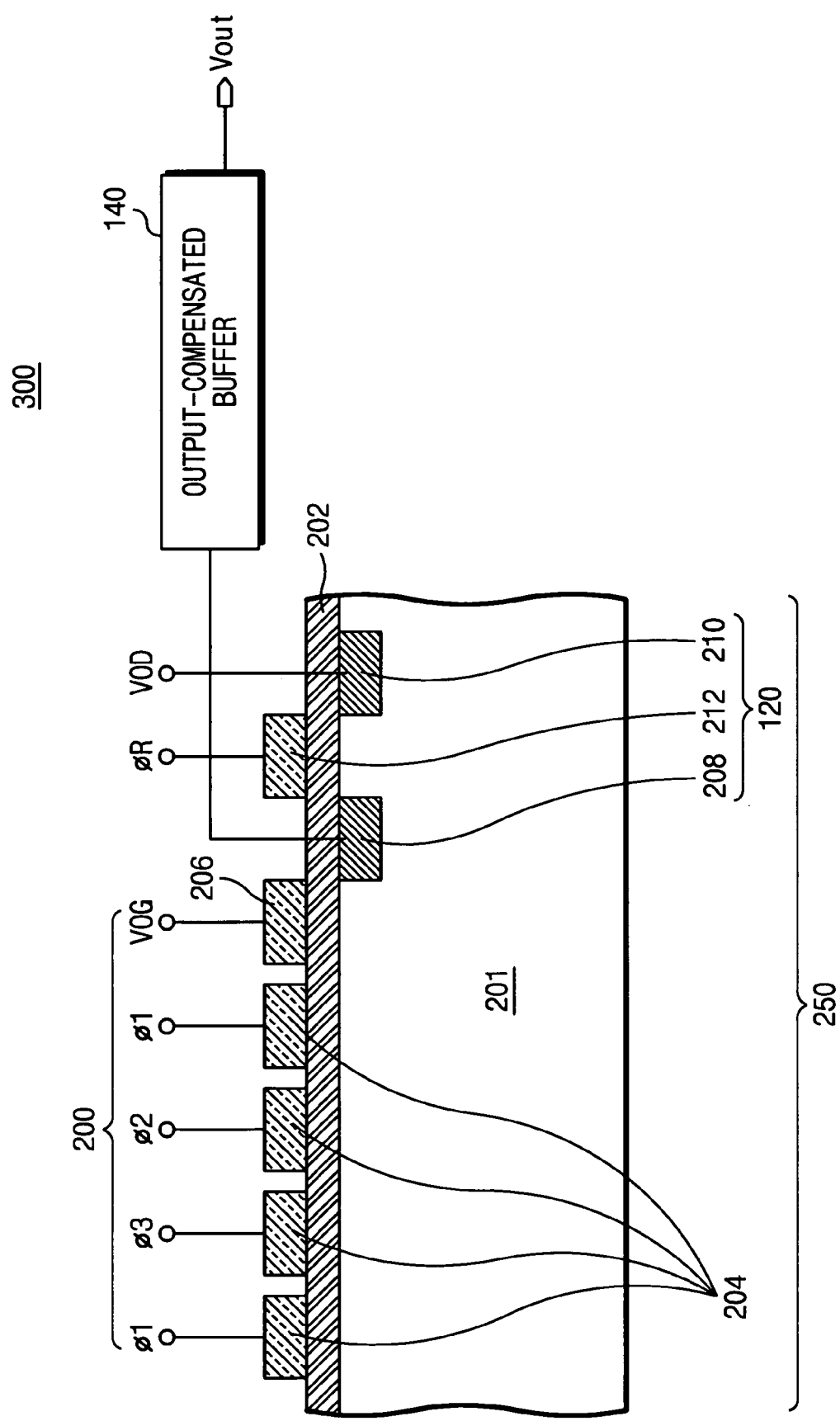
FIG. 2 is a circuit diagram illustrating a CCD in combination with an output-compensated buffer according to an embodiment of the present invention.
Figure 3:
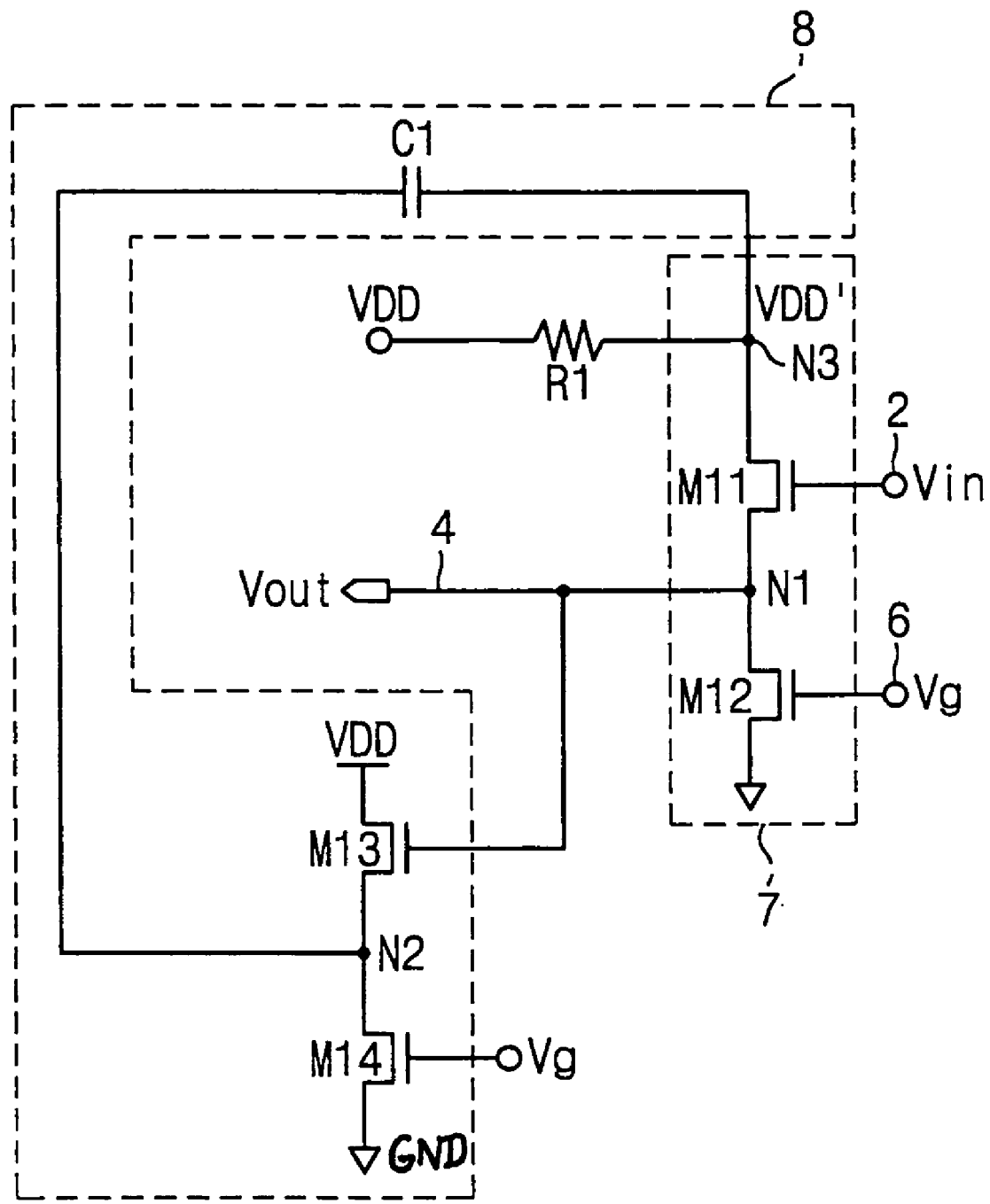
FIG. 3 is a circuit diagram illustrating an output-compensated buffer according to an embodiment of the present invention.
Figure 4:
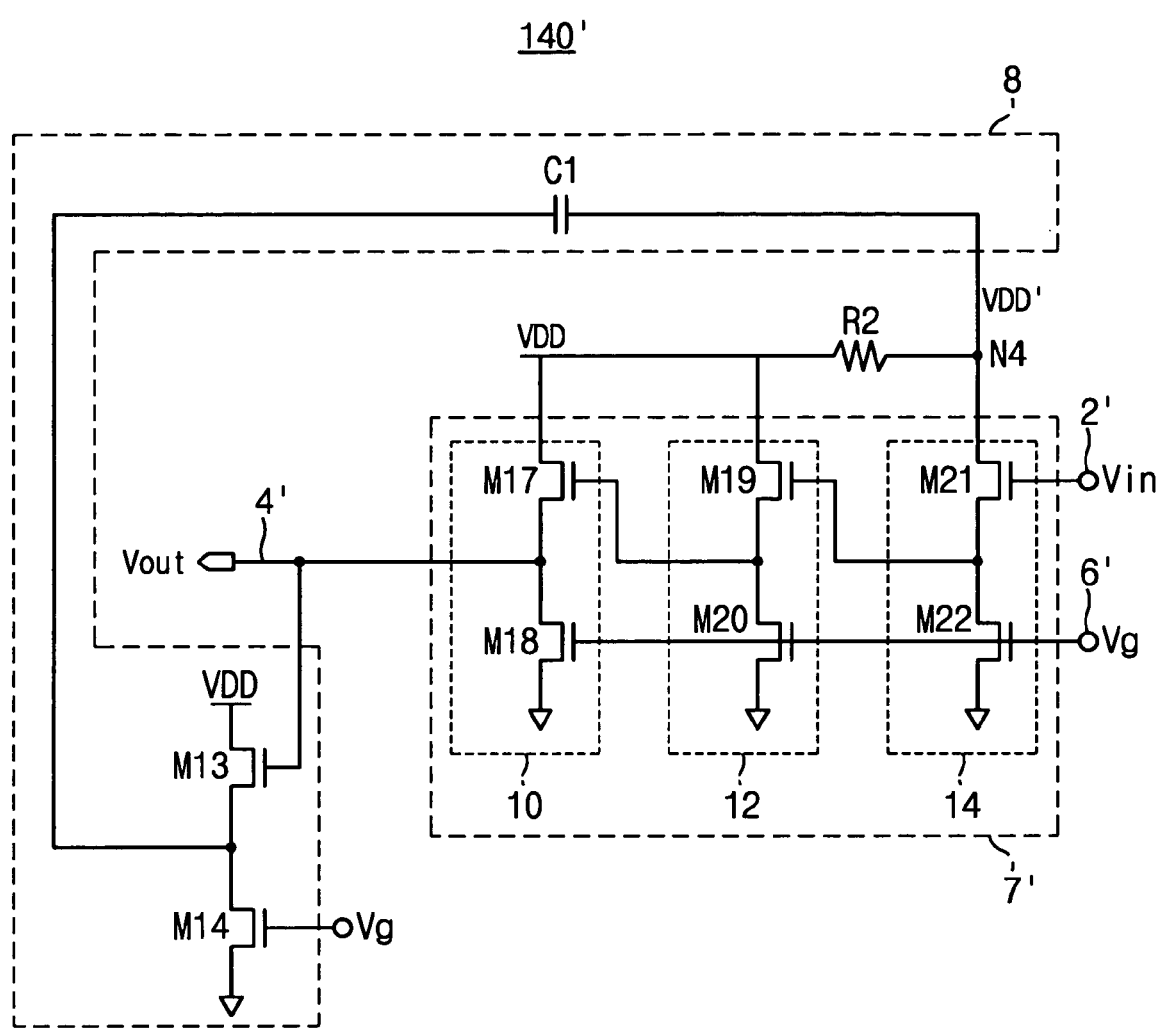
FIG. 4 is a circuit diagram illustrating an output-compensated buffer according to another embodiment of the present invention.

FIG. 2 illustrates an image capture system 300 including a CCD image capture device 250 with a horizontal transfer section 200 and an output circuit including a reset transistor 120, connected to an output-compensated buffer 140, such as the output compensated buffers 140, 140' illustrated in FIGS. 3 and 4. The CCD image capture device 250 includes a P type semiconductor substrate 201 having a surface covered by an insulating layer 202. A plurality of transfer gate electrodes 204 are formed on the insulating layer 202. Electrodes 204 on an insulating layer 202 form an array and are driven by multi-phase clock signals (as shown, 3 phase clock signals φ1, φ2, φ3). An output electrode 206 is also formed on the insulating layer 202.

An N type floating diffusion region 208 is formed on the substrate 201 near the output gate electrode 206. A reset gate electrode 212 is formed on the insulating layer 202 near the floating diffusion region 208, and another N type impurity region 210 is formed on the substrate 201 near the reset gate electrode 212 such that the reset gate electrode 212 is disposed between the floating diffusion region 208 and the N type impurity region 210. As a result, a channel is formed beneath the reset gate electrode 212, between the floating diffusion region 208 and the N type impurity region 210. The floating diffusion region 208, the N type impurity region 210 and the reset gate electrode 212 make up a reset transistor 120.

The three clock signals φ1, φ2, φ3 are respectively applied to the transfer gate electrodes 204 such that a transfer well structure formed by the transfer gate electrodes 204 moves toward the output gate electrode 206. The output gate electrode 206 receives gate signal VOG, while the reset gate electrode 212 receives reset signal φR The N type impurity region 210 is biased to a drain voltage VOD. The signals φ1, φ2, φ3, VOG, φR are applied to the transfer gate electrodes 204, the output gate electrode 206, the reset gate electrode 212 and the N type impurity region 210 to control charge transfer to and from the floating diffusion region 208. The floating diffusion region 208 is connected to the output-compensated buffer 140, which buffers signals that are generated by transfer of charge to the floating diffusion region 208 by the action of the electrodes 204, 206, producing output signals (voltages) Vout.

In order to convert weak charges into signals, the output-compensated buffer 140 preferably exhibits high gain. In order to achieve such high gain, it is desirable to reduce and preferably minimize the capacitance at the diffusion region 208, which includes the input capacitance of the output-compensated buffer 140. For a charge injection of ΔQ, the variation ΔV in voltage at the diffusion region 208 is given by:

$$\Delta V = \frac{\Delta Q}{Cs},$$

where Cs indicates the capacitance at the diffusion region 208. As can be seen in the above formula, reducing the capacitance C increases the voltage variation ΔV, and thus can improve sensitivity.

The relationship of capacitance of a signal source, such as the above described capacitance Cs of a CCD horizontal output section, connected to an input source follower circuit may be related to the input capacitance C of the input source follower circuit itself and the gain A1 of the input source follower circuit by:

$$C=(1-A1)Cs,$$

where A1 has a value less than 1. As the input capacitance C of the input source follower circuit is decreased, the gain A1 is increased, thus resulting in increased gain for the output buffer in which the source follower circuit is used.

FIG. 3 illustrates an output-compensated buffer 140 according to an embodiment of the present invention. The output-compensated buffer 140 includes a buffer circuit 7 and a feedback circuit 8. The buffer circuit 7 includes an input terminal 2, an output terminal 4, a control terminal 6, and a bias terminal N3. As illustrated, the buffer circuit 7 includes a single source follower circuit including first and second NMOS transistors M11 and M12. The first NMOS transistor M11 has a gate terminal that receives an input signal Vin at the input terminal 2 and a source terminal connected to the drain terminal of the second NMOS transistor M12. The first NMOS transistor M11 also has a drain terminal connected to a resistor R1 at a node N3, with the resistor R1 also being connected to a power source VDD, such that a secondary power supply voltage VDD' is applied to the drain terminal of the first NMOS transistor M11. The second NMOS transistor has a gate terminal that receives a control signal Vg applied at the control terminal 6 and a source terminal connected to a signal ground GND. In the source follower configuration shown, the first NMOS transistor M11 serves as a driving transistor, while the second NMOS transistor M12 serves as a load transistor.

The feedback circuit 8 includes another source follower circuit, including an NMOS transistor M13 with a source terminal connected to a drain terminal of an NMOS transistor M14 at a node N2. The NMOS transistor M13 has a drain terminal connected to the power source VDD, and a gate terminal that receives the output signal Vout produced by the buffer circuit 7. The NMOS transistor M14 has a source terminal connected to the signal ground GND and a gate terminal that receives the control signal Vg. The node N2 of the feedback circuit 8 is capacitively coupled to the node N3 of the buffer circuit 7 by a capacitor C1. The capacitive coupling provided by the capacitor C1 allows AC (alternating current) components to be transferred to the power source VDD, which reduces the input capacitance of the NMOS transistor M11 of the buffer circuit through a Miller effect. This can increase the AC gain of the output-compensated buffer 140.

FIG. 4 illustrates an output compensated buffer 140' according to another embodiment of the present invention. The output-compensated buffer 140' includes a buffer circuit 7' with an input terminal 2', an output terminal 4', a control terminal 6' and a bias terminal N4. The buffer circuit 7' has a 3-stage structure including an input source follower circuit 14 and additional second and third stage source follower circuits 10, 12. The input source follower circuit 14 includes driving and load NMOS transistors M21, M22. A gate terminal of the driving transistor M21 receives an input signal Vin applied at the input terminal 2', and has a source terminal connected to the drain terminal of the load transistor M22. The gate terminal of the load transistor M22 receives a control signal Vg applied at the control input 6'. The drain terminal of the driving transistor is connected to one terminal of a resistor R2 at a node N4. The resistor R2 has a second terminal connected at to a power source VDD, such that a secondary power supply voltage VDD' is applied to the drain terminal of the driving transistor M21.

The second and third stage source follower circuits 12, 10 include respective driving/load transistor pairs M19/M20, M17/M18. The gate terminal of the driving transistor M19 of the second stage source follower circuit 12 is connected to the output of the input source follower circuit 14, i.e., at the junction of the source and drain terminals of the driving and load transistors M21, M22. The drain terminal of the driving transistor M19 is connected to the power source VDD. The gate terminal of the driving transistor M17 of the third stage source follower circuit 10 is connected to the output of the second stage source follower circuit 12, at the junction of the source and drain terminals of the driving and load transistors M19, M20. The drain terminal of the driving transistor M17 is connected to the power source VDD. The output of the third stage source follower circuit, i.e., the junction of the source and drain terminals of the driving and load transistors M17, M18, is connected to the output terminal 4', where the output signal Vout is produced.

The output compensated buffer 140' is connected to a feedback circuit 8 such as previously described with reference to FIG. 3. The capacitor C1 of the feedback circuit 8 is connected to the first source follower circuit 14 and the gate of the transistor M13 of the feedback circuit 8 is connected to the output of the third source follower circuit 10. As the components of the feedback circuit 8 have been described with reference to FIG. 3, they will not be discussed in further detail.

Figure 5:
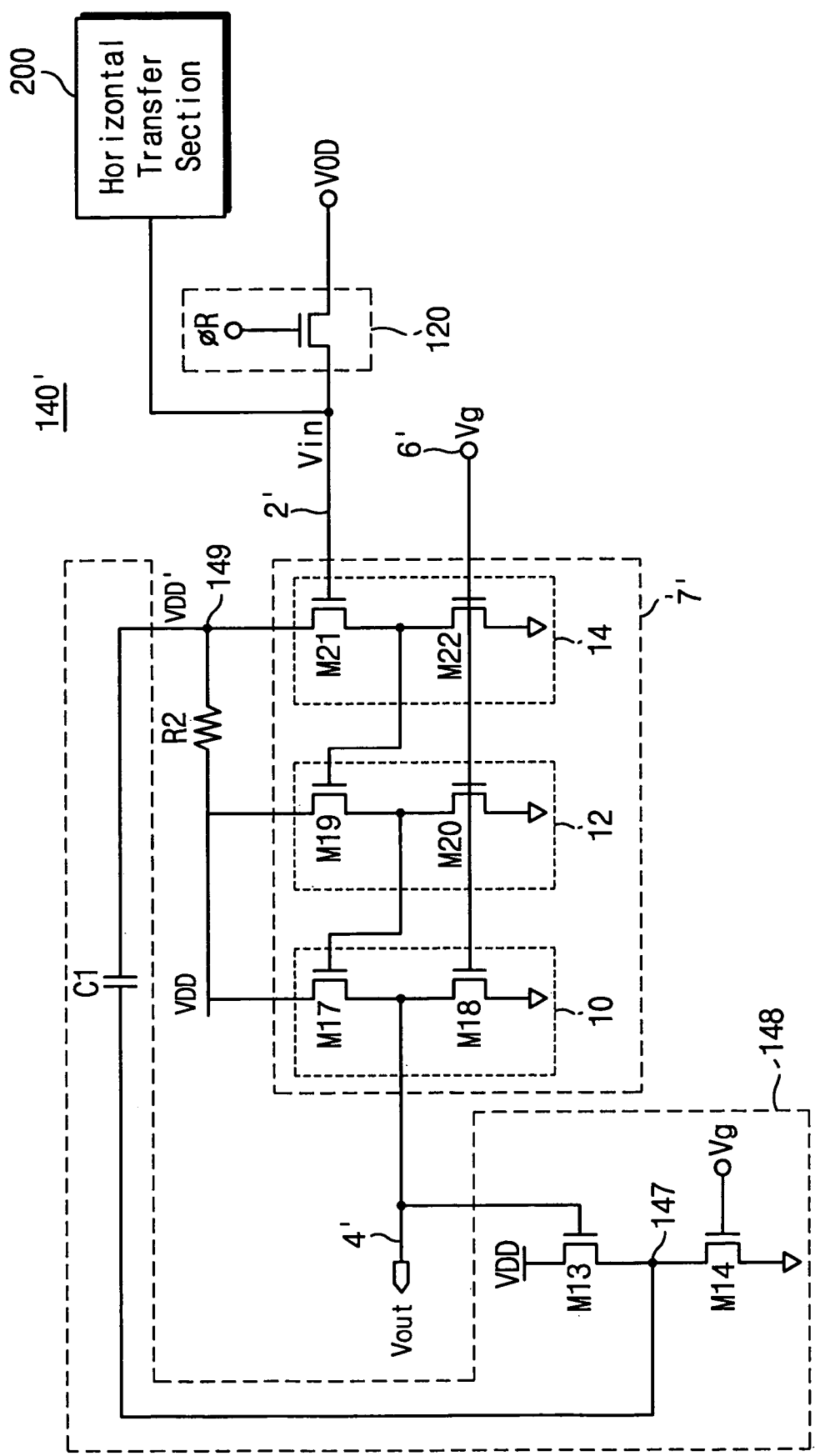
FIG. 5 is a circuit diagram of the output-compensate buffer of FIG. 4 in combination with a horizontal transfer section of a CCD.

FIG. 5 is a schematic diagram illustrating the output-compensated buffer 140' of FIG. 4 in combination with a CCD horizontal transfer section 200 and reset transistor 120. Charges supplied by the horizontal transfer section 200 are injected at the source terminal of the reset transistor 120. The voltage Vin at the source terminal of the reset transistor 120 is applied to the input source follower circuit 14 of the buffer circuit 7'. As the components of the output buffer circuit 140' have been previously described with reference to FIG. 4, further detailed description of these components will not be provided.

Figure 6A:
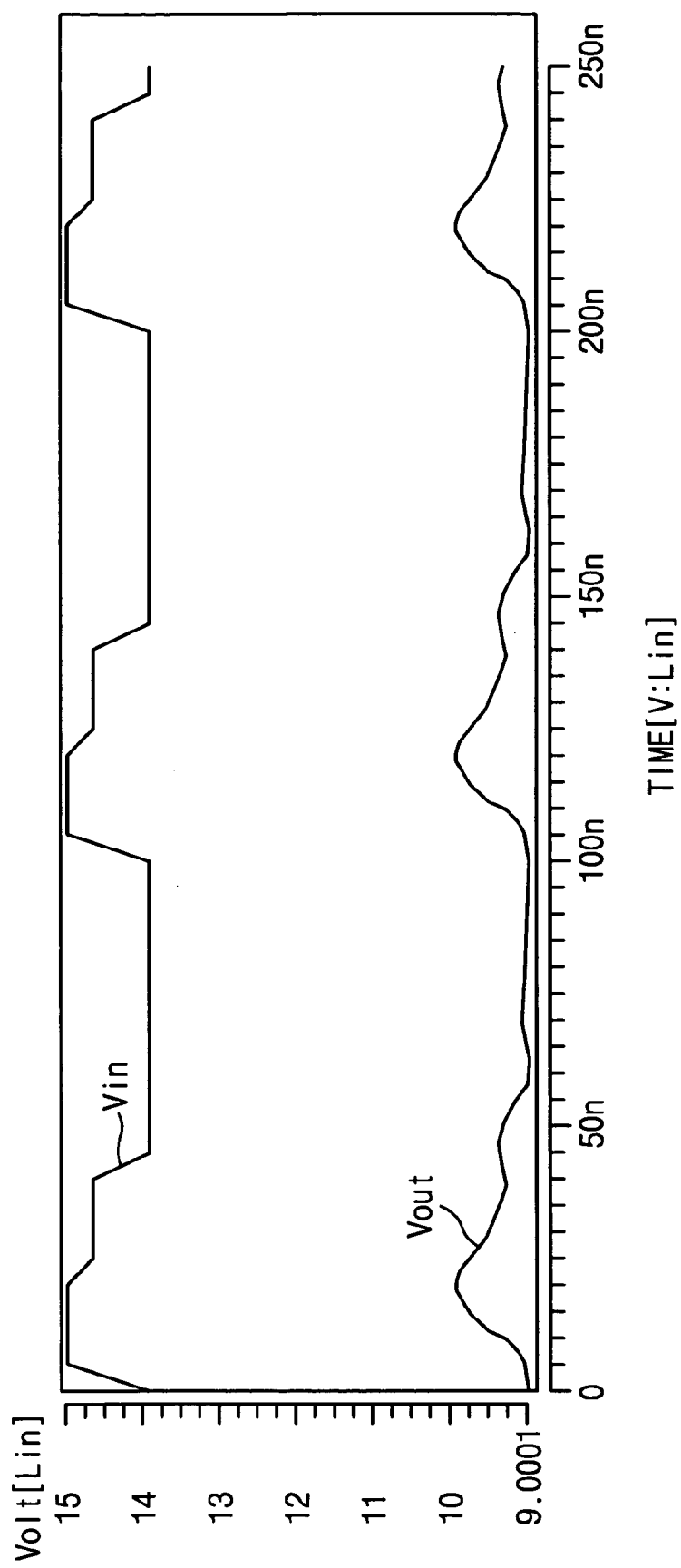
FIGS. 6a–6b are waveform diagrams illustrating exemplary operations of an output-compensated buffer according to an embodiment of the present invention.
Figure 6B:
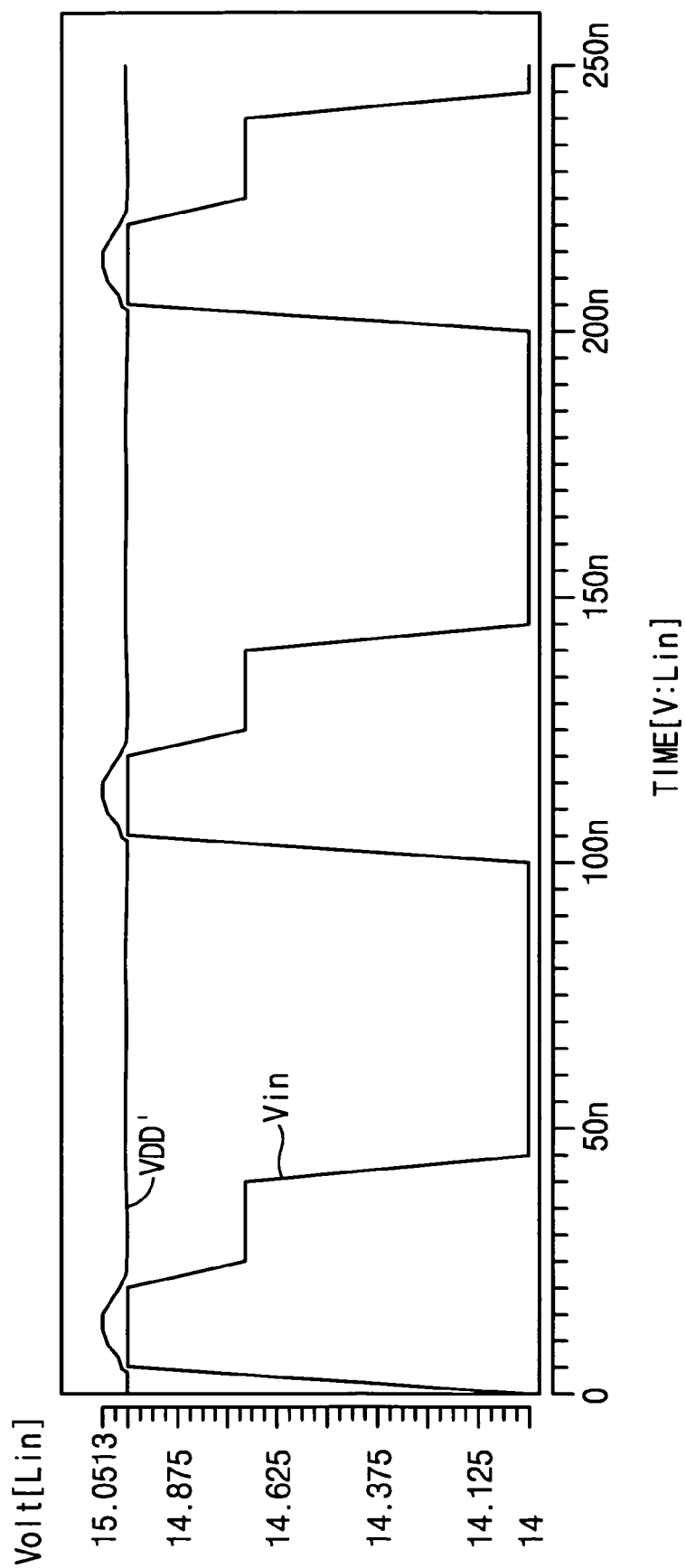

Referring to FIG. 6a, as the level of the input signal Vin increases, the voltage at the source terminal of the driving transistor M21 increases proportionally to the input signal Vin. The voltage levels produced at the source terminals of the driving transistors M19 and M17 of the second and third stage source follower circuits 12 and 10 also increase proportionally to the voltages applied to their respective gate terminals, producing an output signal Vout that increases responsive to an increase in the input signal Vin. As shown in FIG. 6b, the AC gain of the buffer circuit is boosted by the action of the capacitor C1 and the feedback circuit 8, by boosting the effective bias voltage (secondary power supply voltage) VDD' applied the drain terminal of the driving transistor M21.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:

1. An output-compensated buffer, comprising:
    a buffer circuit that receives an input signal and produces an output signal responsive thereto at an output terminal, said buffer circuit including an input source-follower circuit that receives the input signal; and
    a feedback circuit having an input connected to said output terminal and an output capacitively connected to a bias terminal of said input source follower circuit and operative to vary an input capacitance of said source follower circuit responsive to the output signal at said output terminal, wherein said feedback circuit is operative to variably capacitively couple the bias terminal to the power source responsive to the output signal at the output terminal and wherein said feedback circuit comprises a second source follower circuit having an input terminal that receives the output signal from the input source follower circuit of the buffer circuit and an output terminal capacitively coupled to the bias terminal of the input source follower circuit.

2. An output-compensated buffer according to claim 1, wherein said second source follower circuit comprises:
    a first transistor having source terminal, a drain terminal connected to the power source, and a gate terminal connected to the output terminal of the buffer circuit;
    a second transistor having a drain terminal connected to the source terminal of the first transistor at a signal node, a drain terminal connected to a signal ground and a gate terminal configured to receive a control signal; and
    a capacitor coupled between the signal node and the bias terminal of the source follower circuit.

3. An output-compensated buffer according to claim 1, in combination with a CCD image capture device, wherein the CCD image capture device includes a horizontal transfer section that generates the input signal.

4. An output-compensated buffer, comprising:
    a buffer circuit that receives an input signal and produces an output signal responsive thereto at an output terminal, said buffer circuit including an input source-follower circuit that receives the input signal wherein said source follower circuit comprises:
        a first transistor having a source terminal, a gate terminal configured to receive the input signal, and a drain terminal connected to a power source through a resistor; and
        a second transistor having a drain terminal connected to the source terminal of the first transistor, a source terminal connected to a signal ground and a gate terminal configured to receive a control signal; and
    a feedback circuit having an input connected to said output terminal and an output capacitively connected to a bias terminal of said input source follower circuit and operative to vary an input capacitance of said source follower circuit responsive to the output signal at said output terminal, wherein said feedback circuit is capacitively coupled to the drain terminal of the first transistor, wherein said feedback circuit is operative to variably capacitively couple the drain terminal of the first transistor to the power source responsive to the output signal at the output terminal, and wherein said feedback circuit comprises:
- a third transistor having source terminal, a drain terminal connected to the power source, and a gate terminal connected to the output terminal of the buffer circuit;
- a fourth transistor having a drain terminal connected to the source terminal of the third transistor, a drain terminal connected to a signal ground and a gate terminal configured to receive a control signal; and
- a capacitor coupled between the drain terminal of the fourth transistor and the drain terminal of the first transistor.

5. An output-compensated buffer, comprising:
a buffer circuit that receives an input signal and produces an output signal responsive thereto at an output terminal, said buffer circuit including an input source-follower circuit that has an input terminal that receives the input signal and a bias terminal that receives a bias voltage from a power source, wherein said source follower circuit comprises:
a first transistor having a source terminal, a gate terminal configured to receive the input signal, and a drain terminal connected to the power source through a resistor; and
a second transistor having a drain terminal connected to the source terminal of the first transistor, a source terminal connected to a signal ground and a gate terminal configured to receive a control signal; and
a feedback circuit connected to said output terminal and to said input source follower circuit and operative to variably couple the power source and the bias terminal via a capacitor, wherein said feedback circuit is coupled to the drain terminal of said first transistor and, wherein said feedback circuit comprises:
a third transistor having source terminal, a drain terminal connected to the power source, and a gate terminal connected to the output terminal of the buffer circuit;
a fourth transistor having a drain terminal connected to the source terminal of the third transistor, a drain terminal connected to a signal ground and a gate terminal configured to receive a control signal; and
a capacitor coupled between the drain terminal of the fourth transistor and the drain terminal of the first transistor.

6. An output-compensated buffer according to claim 5 in combination with a CCD image capture device, wherein the CCD image capture device comprises a horizontal transfer section that generates input signal.

* * * * *